(12) United States Patent
Koyasu

(10) Patent No.: US 11,451,202 B2
(45) Date of Patent: Sep. 20, 2022

(54) SIGNAL OUTPUT CIRCUIT

(71) Applicant: DENSO CORPORATION, Kariya (JP)

(72) Inventor: Takahisa Koyasu, Kariya (JP)

(73) Assignee: DENSO CORPORATION, Kariya (JP)

( * ) Notice: Subject to any disclaimer, the term of this patent is extended or adjusted under 35 U.S.C. 154(b) by 8 days.

(21) Appl. No.: 17/130,011

(22) Filed: Dec. 22, 2020

(65) Prior Publication Data

US 2021/0111682 A1    Apr. 15, 2021

Related U.S. Application Data

(63) Continuation of application No. PCT/JP2019/019301, filed on May 15, 2019.

(30) Foreign Application Priority Data

Jul. 12, 2018 (JP) .............................. JP2018-132345

(51) Int. Cl.
*H03F 1/52* (2006.01)
*H03F 3/45* (2006.01)

(52) U.S. Cl.
CPC ........... *H03F 3/45179* (2013.01); *H03F 1/52* (2013.01); *H03F 2200/141* (2013.01); *H03F 2200/171* (2013.01); *H03F 2200/33* (2013.01); *H03F 2200/441* (2013.01)

(58) Field of Classification Search
CPC ........... H03F 3/45179; H03F 2200/141; H03F 2200/171; H03F 2200/33; H03F 3/245; H03F 3/343; H03F 1/34; H03F 3/72; H03K 17/16
USPC ................................ 330/277, 288, 296, 297
See application file for complete search history.

(56) References Cited

U.S. PATENT DOCUMENTS 5,164,611 A   11/1992   Summe
5,872,474 A   2/1999   Kagomiya et al.

FOREIGN PATENT DOCUMENTS

JP   S58-64119 U   4/1983
JP   4622875 B2   8/2007
JP   5477264 B2   6/2012

*Primary Examiner* — Khanh V Nguyen
*Assistant Examiner* — Khiem D Nguyen
(74) *Attorney, Agent, or Firm* — Posz Law Group, PLC

(57) ABSTRACT

A signal output circuit includes an inverting amplifier circuit, a feedback capacitor and a low pass filter. The inverting amplifier circuit includes an input terminal and an output terminal. The inverting amplifier circuit executes an inverting amplification based on an input signal to output a signal to the output terminal at a pull-up state. An output stage of the inverting amplifier circuit is an open collector or an open drain. The feedback capacitor is connected between the input terminal and the output terminal of the inverting amplifier circuit. The low pass filter has an input and an output. The input of the low pass filter is connected to the output terminal of the inverting amplifier. The output of the low pass filter is connected to the feedback capacitor.

8 Claims, 9 Drawing Sheets

| Vp-p | Freq[MHz] | | | | | | | | | |
|---|---|---|---|---|---|---|---|---|---|---|
| | 2 | 4 | 5 | 8 | 10 | 15 | 20 | 30 | 40 | 50 |
| 2 | ○ | — | ○ | — | ○ | ○ | ○ | | | |
| 4 | ○ | — | ○ | — | ○ | ○ | ○ | | | |
| 6 | ○ | — | ○ | — | ○ | ○ | ○ | | | |
| 8 | ○ | — | ○ | — | ○ | ○ | ○ | | | |
| 10 | ○ | — | ○ | — | ○ | ○ | ○ | | | |
| 12 | × | — | ○ | — | ○ | × | ○ | | | |
| 14 | × | — | ○ | — | × | × | × | | | |

Min WITHSTAND VOLTAGE 10Vpp

| | Freq[MHz] | | | | | | | | | |
|---|---|---|---|---|---|---|---|---|---|---|
| Vp-p | 2 | 4 | 5 | 8 | 10 | 15 | 20 | 30 | 40 | 50 |
| 2 | | | | | | | | | | |
| 4 | | | | | | | | | | |
| 6 | | | | | | | | | | |
| 8 | | | | | | | | | | |
| 10 | | | | | | ○ | | | | |
| 12 | ○ | | | | | | | | | |
| 14 | ○ | | ○ | ○ | ○ | | ○ | ○ | ○ | ○ |
| 16 | ○ | | ○ | ○ | ○ | | ○ | ○ | ○ | ○ |
| 18 | ○ | | ○ | ○ | ○ | ○ | ○ | ○ | ○ | ○ |
| 20 | ○ | | ○ | ○ | ○ | ○ | ○ | ○ | × | × |

Min WITHSTAND VOLTAGE 18Vpp

SIGNAL OUTPUT CIRCUIT

CROSS REFERENCE TO RELATED APPLICATIONS

The present application is a continuation application of International Patent Application No. PCT/JP2019/019301 filed on May 15, 2019, which designated the U.S. and claims the benefit of priority from Japanese Patent Application No. 2018-132345 filed on Jul. 12, 2018. The entire disclosures of all of the above applications are incorporated herein by reference.

TECHNICAL FIELD

The present disclosure relates to a signal output circuit.

BACKGROUND

There has been known a signal output circuit including an inverting amplifier circuit in which a signal is output to a pull-up output terminal by executing an inverting amplification operation based on an input signal, and an output stage of the inverting amplifier circuit is a pull-up type.

SUMMARY

The present disclosure describes a signal output circuit including an inverting amplifier circuit executing an inverting amplification operation, a feedback capacitor connected between input and output terminals of the inverting amplifier circuit, and a low pass filter.

BRIEF DESCRIPTION OF DRAWINGS

Other objects, features and advantages of the present disclosure will become more apparent from the following detailed description made with reference to the accompanying drawings. In the drawings.

DETAILED DESCRIPTION

Figure 1:
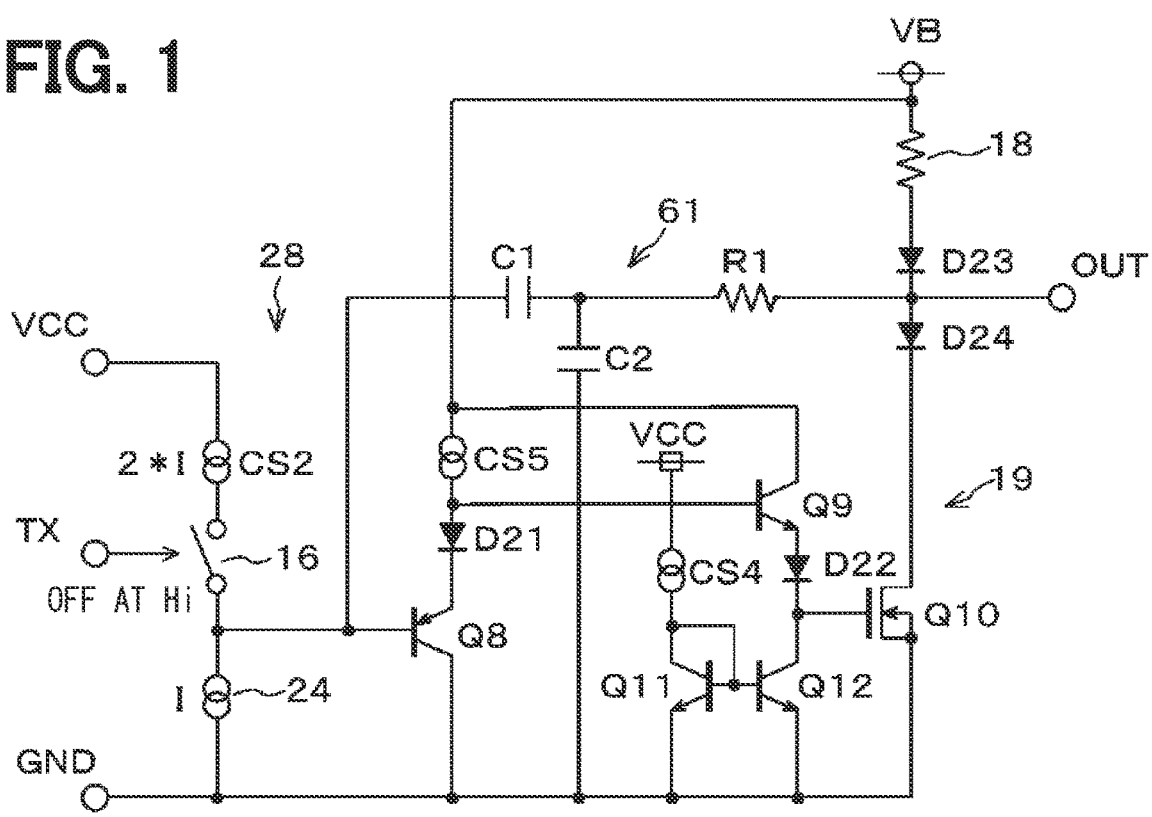
FIG. 1 is a circuit diagram illustrating the configuration of a signal output circuit according to a first embodiment.

A communication driver circuit may include an inverting amplifier circuit provided with, for example, an open collector whose output stage is at a pull-up state. The inverting amplifier circuit performs an inverting amplification operation based on an input transmission signal. A feedback capacitor may be connected between input and output terminals of the inverting amplifier circuit. In a situation where an inverting amplifier circuit inverts and amplifies the input transmission signal and then outputs the communication signal to a communication line, which is at a pull-up state, the capacitor applies negative feedback to the level change in the signal. Therefore, the level change in the communication signal becomes slower, and the noise superimposed on the output communication signal may be reduced.

In the above configuration, since the negative feedback is applied to the level change in the output signal, a noise component input through the output terminal may enter an internal circuit through the feedback capacitor. In a situation where the noise component exceeds a certain level, the transistor as the output stage may have an erroneous operation. As a countermeasure against the erroneous operation, a device such as a filter, capacitor, coils or ferrite beads is needed to be attached to an integrated circuit in the driver circuit.

According to a signal output circuit in the present disclosure, the inverting amplifier circuit has an output stage, which is an open collector or an open drain. Since the signal output circuit outputs a signal to the output terminal at a pull-up state, a feedback capacitor is connected between input and output terminals of the inverting amplifier circuit. The low-pass filter is connected so that the output terminal of the inverting amplifier circuit is at an input side and the feedback capacitor is at an output side.

Therefore, it is possible to remove a noise component entering from the output terminal through the low pass filter. Additionally, it is possible to prevent the noise component from entering the internal circuit through the feedback capacitor and causing the erroneous operation. Therefore, it may not be necessary to include an external device or circuit for noise suppression.

According to a signal output circuit in the present disclosure, a charge/discharge circuit is connected to an input terminal of an inverting amplifier circuit. In a situation where a transmission signal is turned from a low level to a high level, a feedback capacitor is charged. In a situation where the transmission signal is changed from the high level to the low level, the feedback capacitor is discharged. A clamping transistor is connected between a conductive control terminal of the output transistor and the ground, and the conductive control terminal of the transistor is connected to respective connection terminals of the feedback capacitor and the charge/discharge circuit. The clamping transistor conducts in response to that noise is applied to the conductive control terminal of the output transistor, in a situation where the feedback capacitor is discharged.

During the period in which the feedback capacitor is discharged, in a situation where the noise component directly enters the conductive control terminal of the output transistor from the output terminal of the inverting amplifier circuit, the clamping transistor becomes conductive. At this timing, the conductive control terminal of the clamping transistor is turned to a low level by discharging the feedback capacitor. The conductive control terminal of the output transistor is clamped to the level of the conductive control terminal of the clamping transistor with addition to a junction voltage of the transistor. Therefore, it is possible to prevent the output transistor from being conductive.

According to the signal output circuit in the present disclosure, a capacitor is connected to the clamping transistor in parallel. With this configuration, it is possible that the clamping transistor removes noise in a relatively low frequency region, and the capacitor, which is connected to the clamping transistor in parallel, removes noise in a relatively high frequency region. As a result, the amplitude of the noise component entering from the output terminal can be attenuated by the bridge circuit to reduce the influence of noise.

According to the signal output circuit in the present disclosure, the bridge circuit is provided, and the first series circuit and the second series circuit provided with four diodes are connected in parallel. In the bridge circuit, the anode side is connected to a resistive element pulling up the output terminal of the inversion amplifier circuit. An output transistor is connected between the cathode side of the bridge circuit and a ground. The common connection node in the first series circuit is connected to the output terminal, and the common connection node in the second series circuit is connected to a feedback circuit. Therefore, it is possible to reduce the influence of noise by attenuating the amplitude of a noise component entering from the output terminal through the bridge circuit.

First Embodiment

The following describes a first embodiment of the present disclosure.

FIG. 1 illustrates a switch 16 corresponding to a field-effect (FET) transistor, and a constant current source 24 corresponding to a current mirror circuit. If the level of the transmission signal is high, the switch is turned off. The feedback capacitor C1 is discharged when the constant current source 24 attracts the current I. If the level of the transmission signal TX is low, the switch 16 is turned on. The feedback capacitor C1 is charged with the differential current I when the constant current source 24 supplies the current 21. The above configuration corresponds to a charge/discharge circuit 28. The constant current source CS5 is switched to VCC as a 5V power supply, and is connected to the battery supply VB. A diode D21 for level shifting is connected between a constant current source CS5 and the emitter of a transistor Q8.

In the present embodiment, an N-channel MOSFET is adopted for a transistor Q10 as an output transistor. Therefore, the inverting amplifier circuit 19 according to the present embodiment is an open drain type. A diode D22 for level shifting is connected between the emitter of a transistor Q9 and the collector of a transistor Q12 and between the emitter of the transistor Q9 and the gate of the transistor Q10. A diode D23 is inserted between the resistance element 18 and the output terminal OUT, and a diode D24 is inserted between the output terminal OUT and the drain of the transistor Q10.

Figure 2:
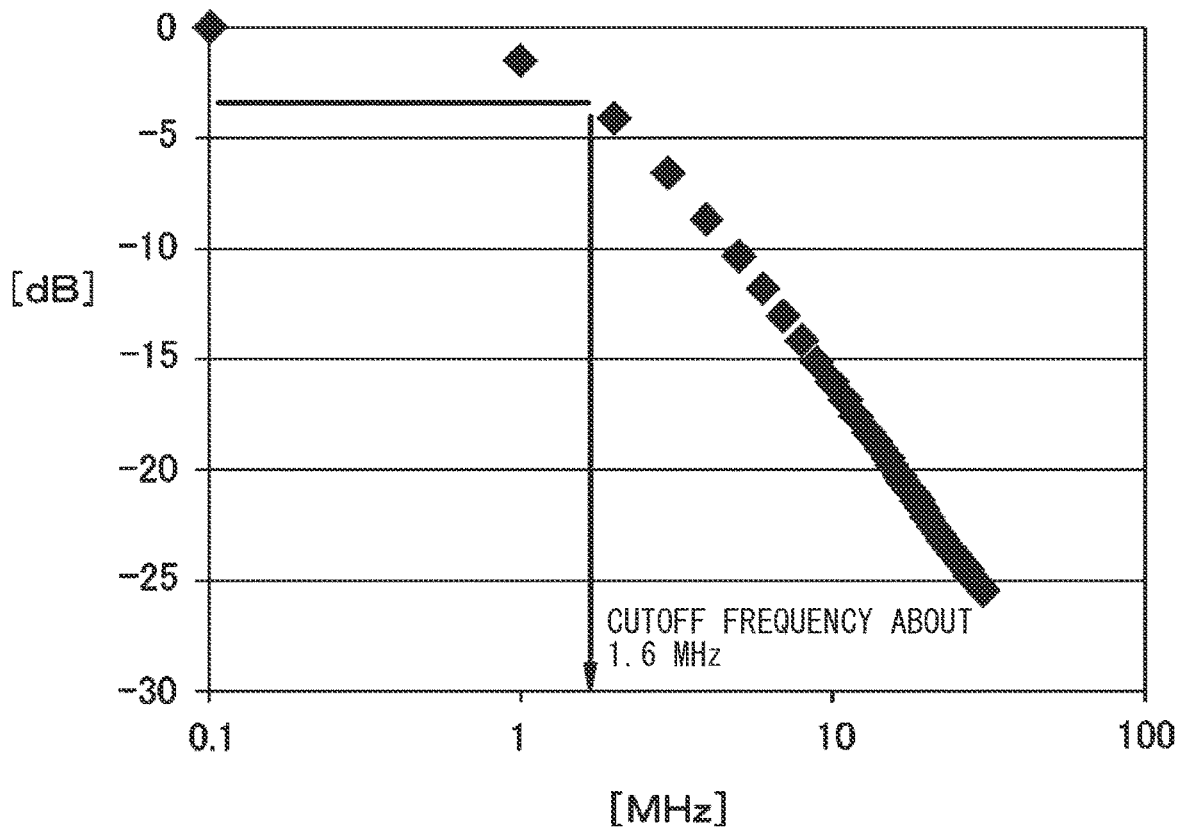
FIG. 2 illustrates a frequency response of a CR filter.

In the present embodiment, a capacitor C2 is connected between a ground and a common connection node, which is between a resistive element R1 and a capacitor C1. The resistive element may also be referred to as a resistor. Thus, the CR filter 61 includes the resistive element R1 and the capacitor C2. For example, in a situation where the resistance value of the resistive element R1 is 10 kΩ and the capacitance of the capacitor C2 is 10 pF, the cutoff frequency of the CR filter 61 is about 1.6 MHz as illustrated in FIG. 2. In a situation of applying to communication such as LIN having an in-vehicle communication network as in the comparative example, trapezoidal waveform control is executed at a frequency of about 500 kHz inside an integrated circuit (IC). The cutoff frequency is set so that noise interference from the output terminal OUT can be removed without affecting the control.

Figure 3:
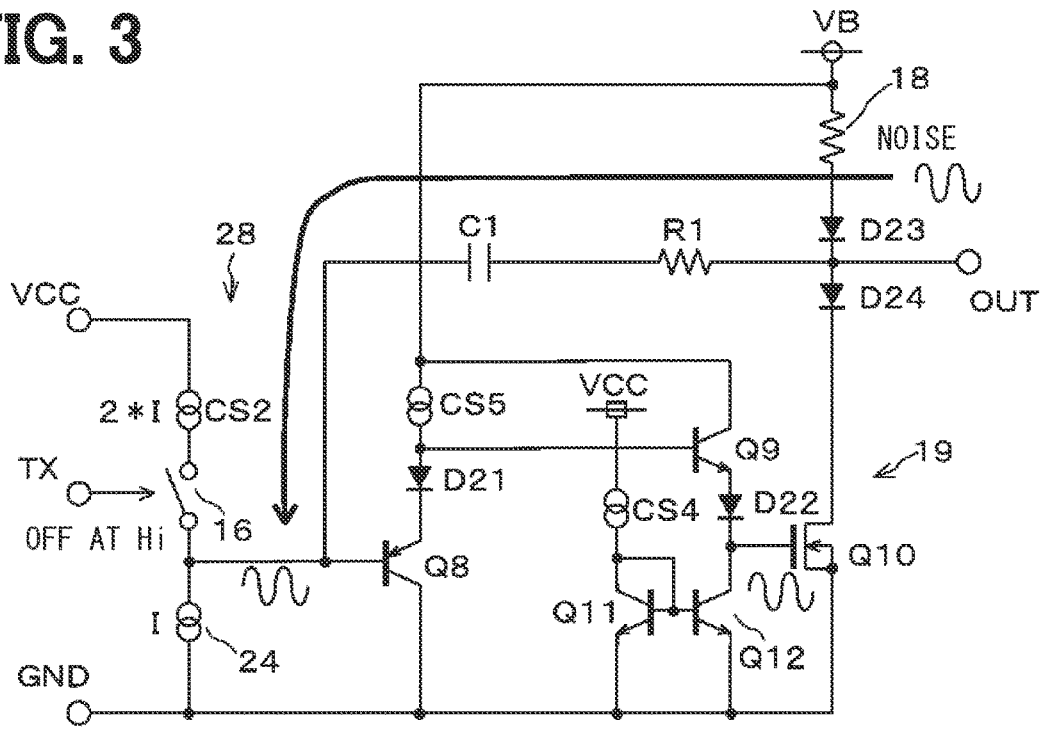
FIG. 3 is a circuit diagram illustrating the wraparound of noise from an output terminal OUT in a comparative example.

In a situation without having the CR filter 61 as in the present embodiment, the noise interference from output terminal OUT changes a base electrical potential of the transistor Q8 through the capacitor C1, as shown in FIG. 3. Along with this situation, the gate electrical potential of the output transistor Q10 fluctuates, and thus an erroneous operation occurs.

Figure 4:
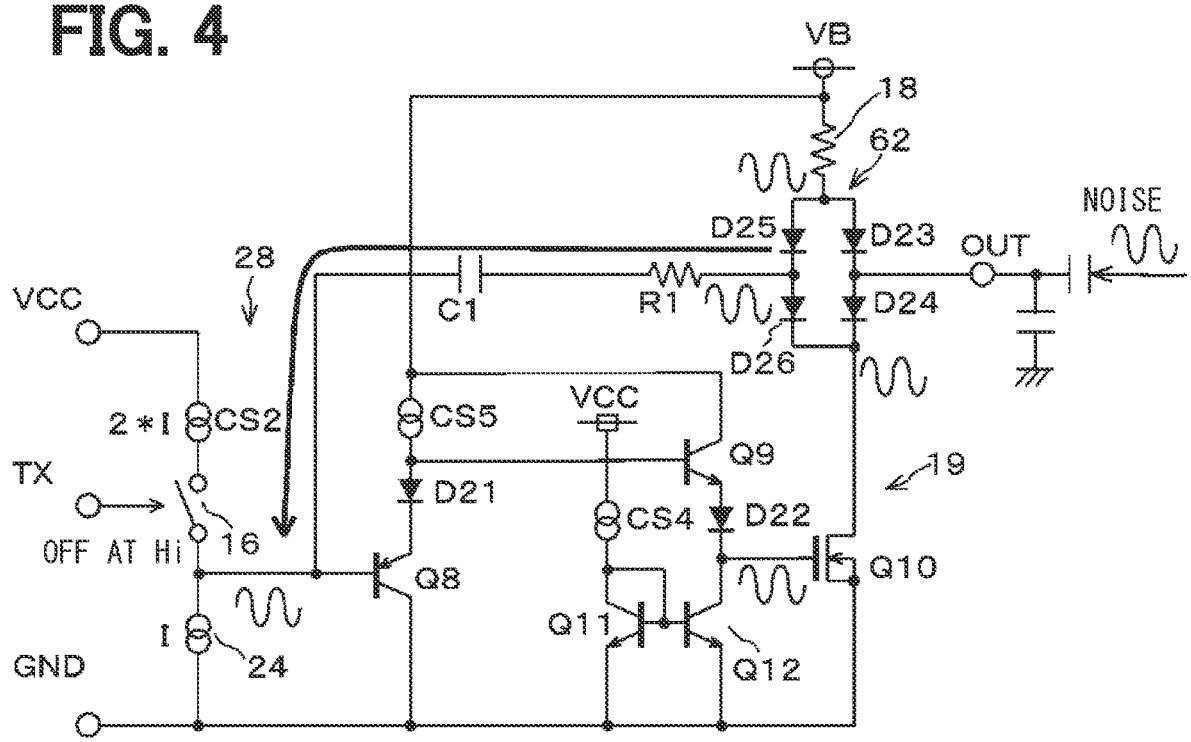
FIG. 4 is a diagram illustrating a circuitry configuration simulating the influence of noise.

With regard to the configuration illustrated in FIG. 4, an AC signal at a frequency in an order of MHz for simulating noise was applied to the output terminal OUT at different voltages, and it is confirmed whether or not the output terminal OUT can be maintained at the high level. A series circuit having the diodes D23 and D24 is connected to a series circuit having the diodes D25 and D26 in parallel. The common connect node between the diodes D25 and D26 is connected to an end of the resistive element R1. The diodes D23 to D26 are included in a bridge circuit 62.

Figures 5, 6:
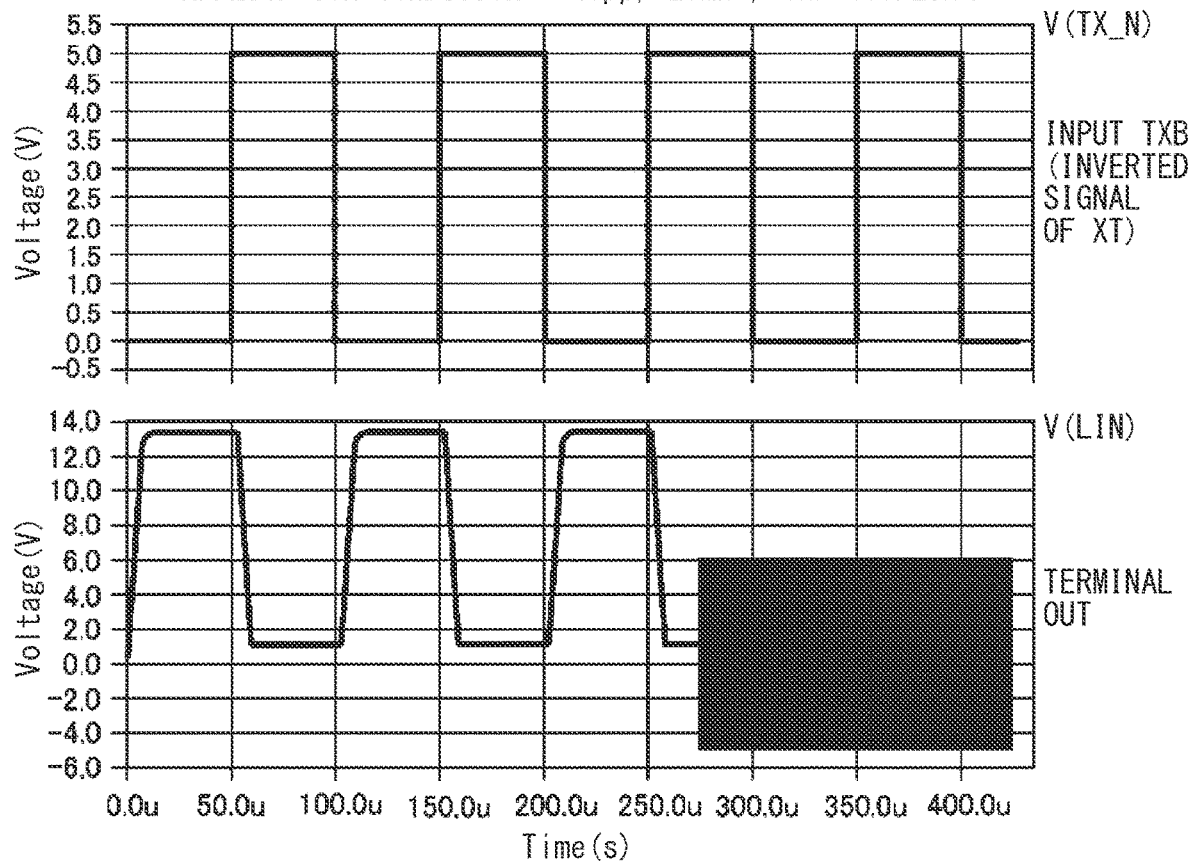
FIG. 5 illustrates the result of noise immunity simulation.
FIG. 6 illustrates a simulation waveform at the output terminal OUT.

A capacitor is connected between the output terminal OUT and the ground, and the AC signal is applied to the output terminal OUT through a series capacitor. As a result, as shown in FIG. 5, the withstand voltage in the frequency range of 2 MHz to 20 MHz was 10 Vpp (peak to peak). As illustrated in FIG. 6, the transmission signal TX is changed to a binary level at regular intervals. In a state where the output terminal OUT outputs the inverted level of the transmission signal TX, an erroneous operation occurs as an AC signal with the frequency of 20 MHz and a voltage of 14Vpp is applied at a coupling capacitor with 1 nF. FIG. 6 illustrates a signal TXB as the inversion of the level of the transmission signal TX.

Figures 7, 8:
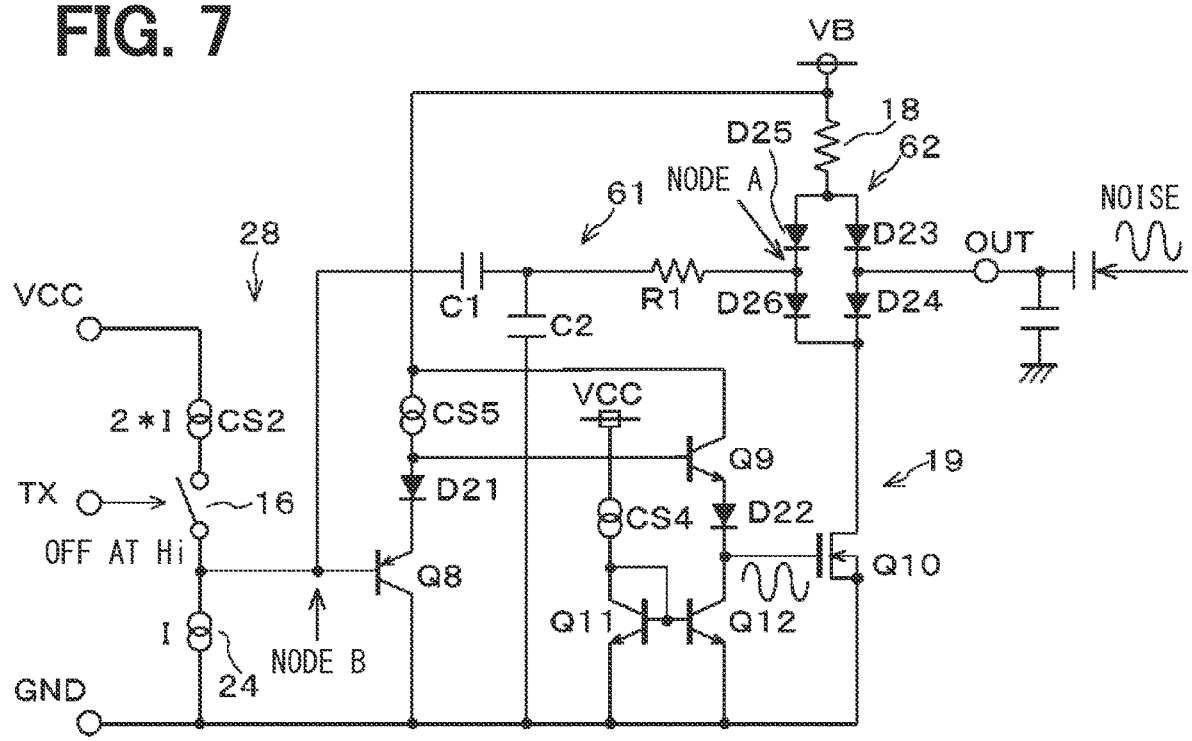
FIG. 7 illustrates a circuitry configuration simulating the influence of noise in the first embodiment.
FIG. 8 illustrates the result of noise immunity simulation.
Figure 9:
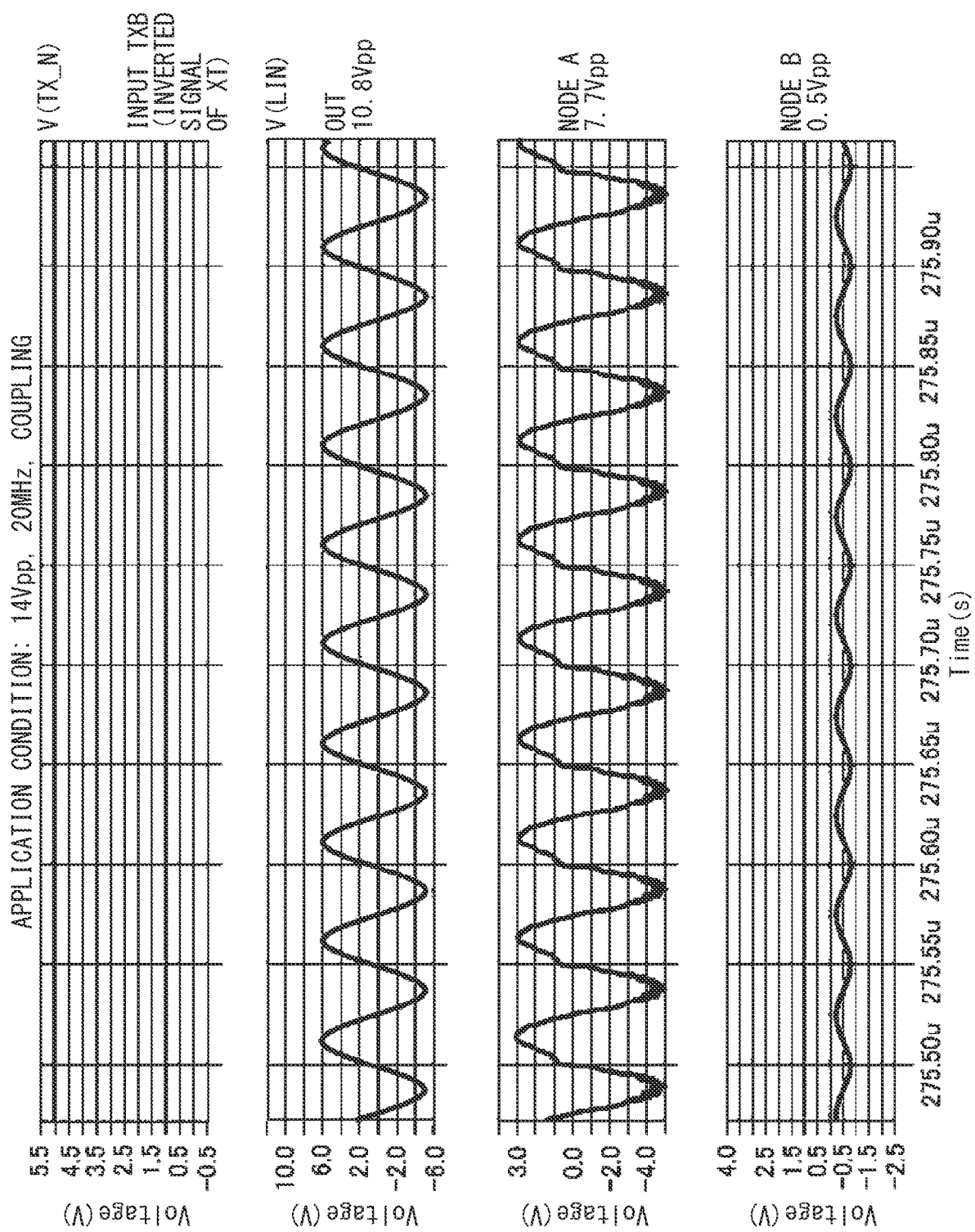
FIG. 9 illustrates a simulation waveform at each device.
Figure 10:
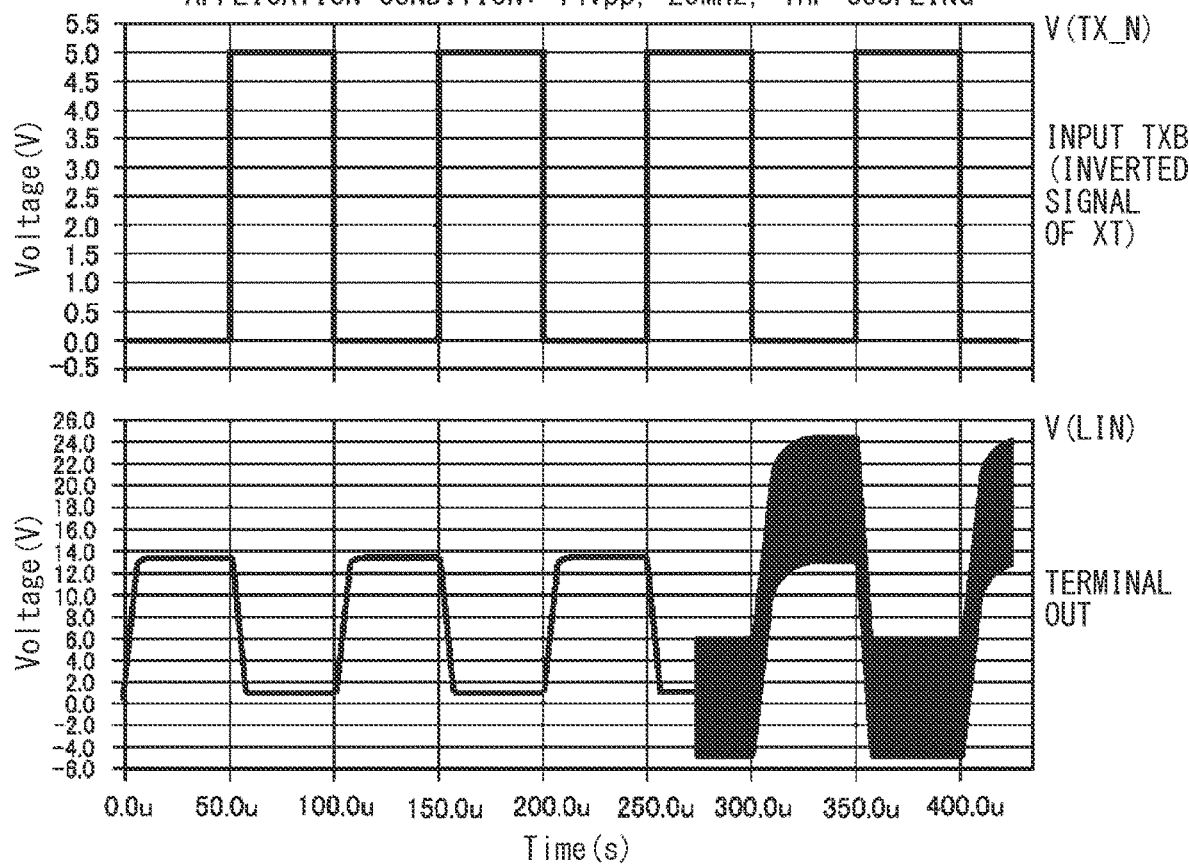
FIG. 10 illustrates a simulation waveform at the output terminal OUT.

On the other hand, the identical simulation is applied to the configuration according to the present embodiment as illustrated in FIG. 7, the withstand voltage in a frequency range of 2 MHz to 50 MHz was improved to 18Vpp as illustrated in FIG. 8. Then, while the transmission signal TX is maintained at a high level, when an AC signal having a frequency of 20 MHz and a voltage of 14 Vpp is applied as in the case shown in FIG. 6, the electric potential of the output terminal OUT is 10.8 Vpp as shown in FIG. 9. The electric potential at a node A, which is one end of the resistive element R1, was 7.7 Vpp. This is the effect of reducing the noise level by the bridge circuit 62. At the node B as the base of the transistor Q8, the amplitude may be further reduced to 0.5 Vpp through the resistive element R1. In a situation where the simulation is performed under the identical conditions as the case illustrated in FIG. 6, it was confirmed that no erroneous operation occurred as illustrated in FIG. 10.

According to the present embodiment, the inverting amplifier circuit 19 has an output stage which is a pull-up type, and outputs a signal to the output terminal OUT, which is at a pull-up state. The feedback capacitor C1 is connected between input and output terminals. The low-pass filter 61 is connected so that the output terminal OUT is at an input side and the feedback capacitor C1 is at an output side.

With this configuration, the noise component that has entered from the output terminal OUT can be removed by the low-pass filter 61, and the noise component is transmitted to the internal circuit via the feedback capacitor C1 to prevent the output transistor Q10 from having an erroneous operation. Therefore, it may not be necessary to include an attached external device or circuit for noise suppression.

A first series circuit includes diodes D23 and D24 connected in a forward direction. A second series circuit includes diodes D25 and D26 connected in a forward direction. The bridge circuit 62 has the first series circuit and the second series circuit connected in parallel. The anode side of the bridge circuit 62 is connected to the resistive element 18. The output transistor Q10 is connected between the cathode side of the bridge circuit 62 and the ground. The common connection node between the diodes D23 and D24 in the first series circuit is connected to the output terminal OUT, and the common connection node between the diodes D25 and D26 is connected to the feedback capacitor C1. As a result, the amplitude of the noise component entering from the output terminal OUT can be attenuated by the bridge circuit 62 to reduce the influence of noise.

Second Embodiment

Figure 11:
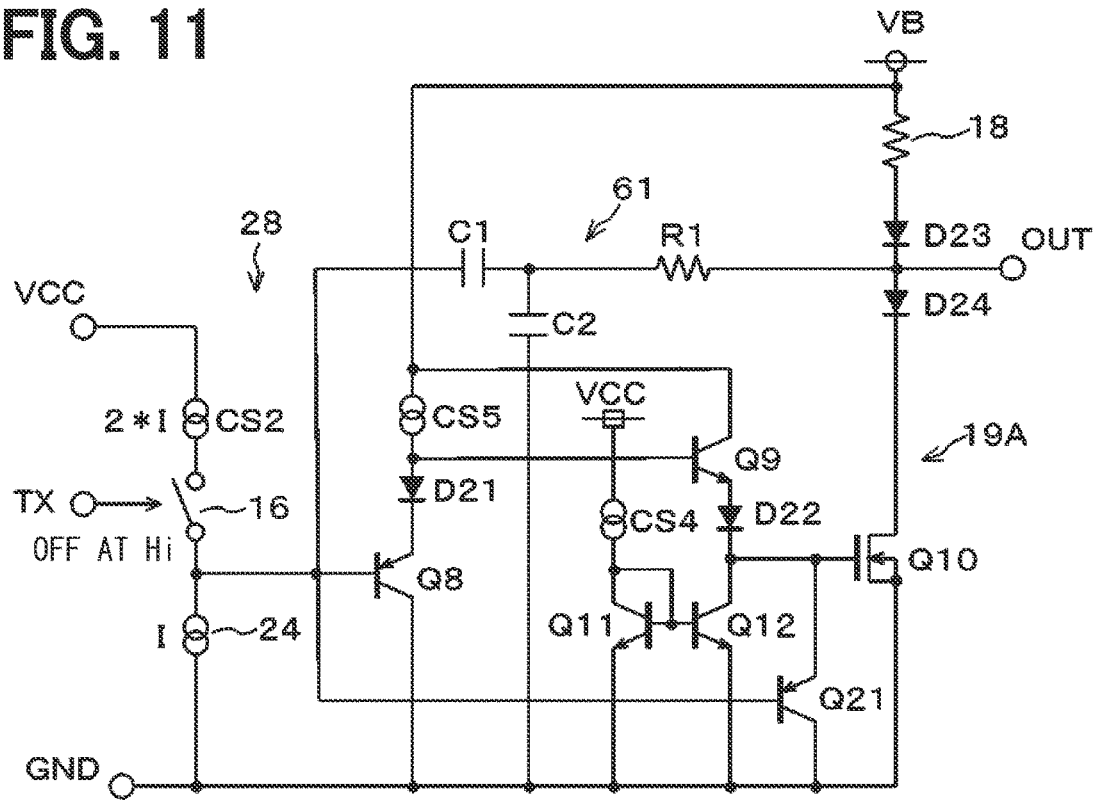
FIG. 11 is a circuit diagram illustrating the configuration of a signal output circuit according to a second embodiment.

Hereinafter, the same components as those of the first embodiment are denoted by the same reference numerals, and descriptions of the same components will be omitted, and different portions will be described. As illustrated in FIG. 11, in the second embodiment, a PNP transistor Q21, which is a clamping transistor, is connected between the gate of the output transistor Q10 and the ground. The base of the transistor Q21 is connected to the base of the transistor Q8. The threshold voltage of the transistor Q10 is denoted as VT, and the voltage between the base and emitter of the transistor Q21 is denoted as VF. It is set to satisfy the relation VT>VF. As a result, an inverting amplifier circuit 19A is formed.

The following describes an operation in the second embodiment. During the period when the transmission signal TX shows a high level, since the capacitor C1 is discharged, the respective base electrical potentials of the transistors Q8 and Q21 are at a low level. In this state, when the noise entering from the output terminal OUT is directly applied to the gate of the transistor Q10, the transistor Q21 is turned on. Therefore, the gate electrical potential of the transistor Q10 is clamped by the voltage VF between the base and the emitter of the transistor Q21. Therefore, the erroneous operation of the transistor Q10 is prevented.

According to the second embodiment, the transistor Q21 is connected between the gate of the output transistor Q10 and the ground, and the base of the transistor Q21 is connected to the connection terminal of the feedback capacitor C1 and the connection terminal of the charge/discharge circuit 28. Then, when noise is applied to the gate of the output transistor Q10 while the feedback capacitor C1 is being discharged, the transistor Q21 is turned on to clamp the gate potential with the voltage VF. Therefore, it is possible to prevent the erroneous operation of the transistor Q10.

Third Embodiment

Figure 12:
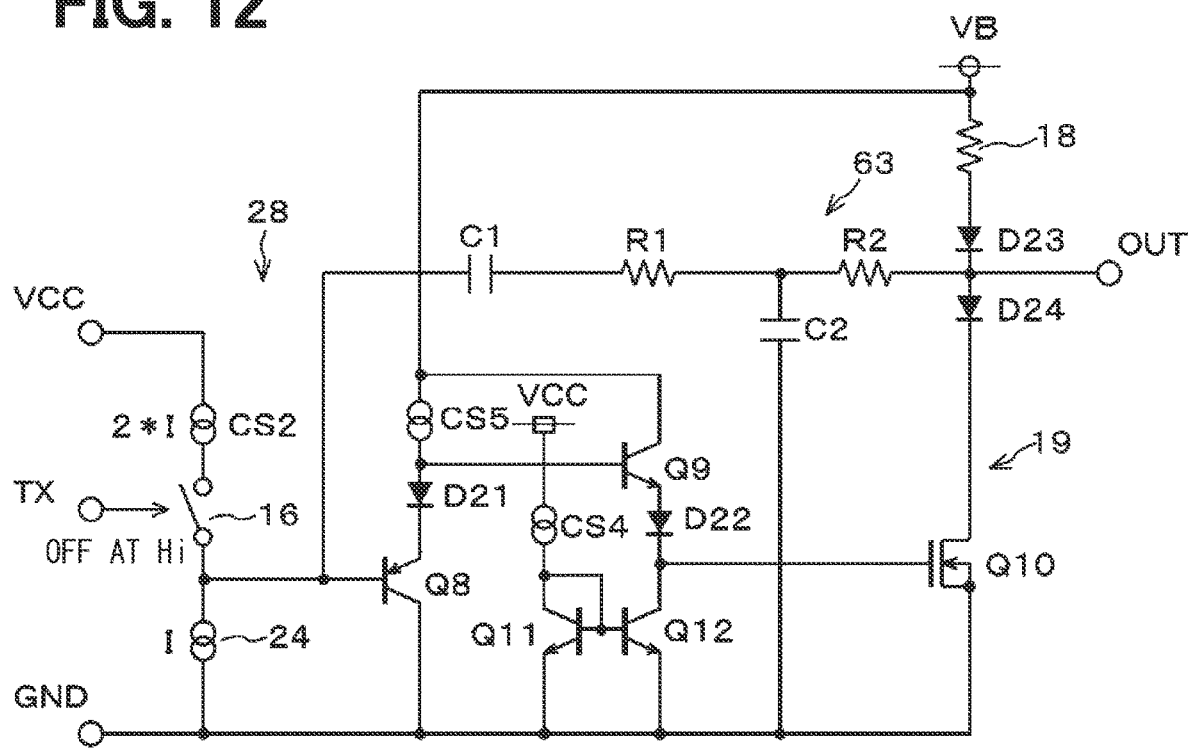
FIG. 12 is a circuit diagram illustrating the configuration of a signal output circuit according to a third embodiment.

As illustrated in FIG. 12, in the third embodiment, a resistive element R2 is inserted between the resistive element R1 and the output terminal OUT. Then, the capacitor C2 is connected between the common connection node, which is between the resistive elements R1 and R2, and the ground, and the resistance element R2 and the capacitor C2 are included in a CR filter 63. Also in the third embodiment, the identical effects as those of the first embodiment can be attained.

Fourth Embodiment

Figure 13:
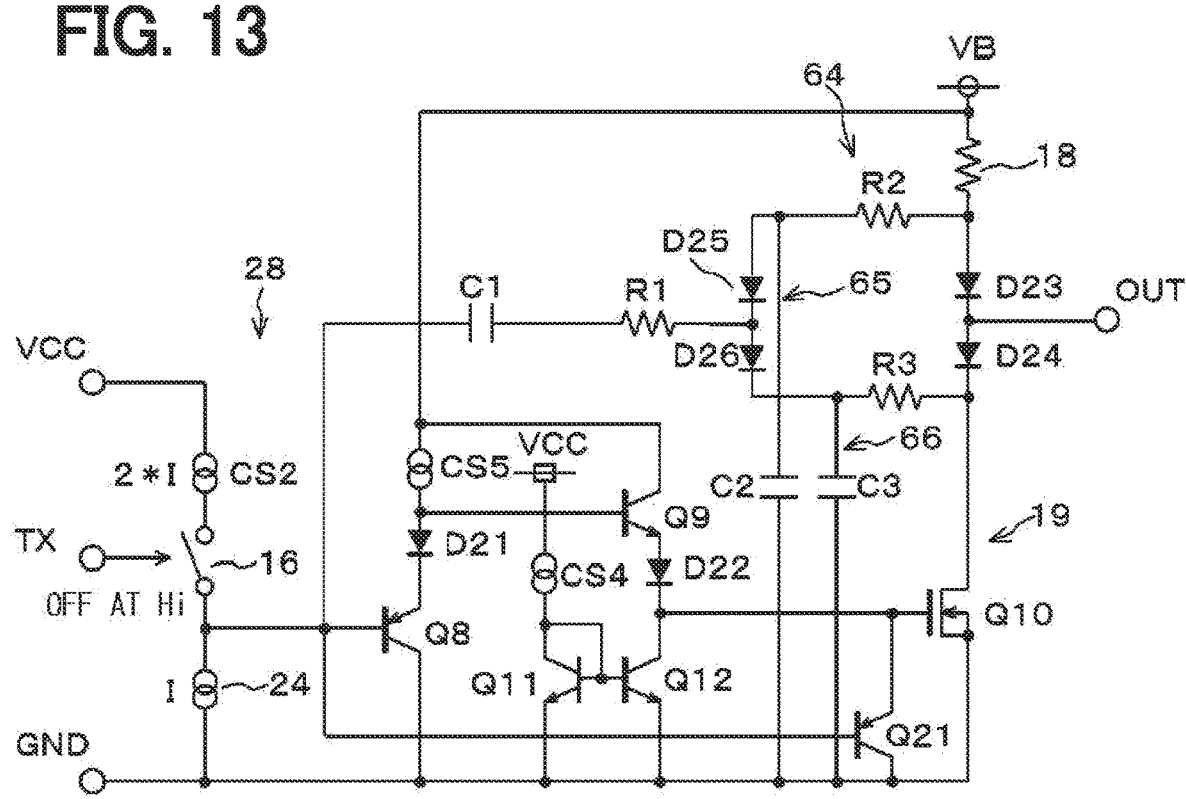
FIG. 13 is a circuit diagram illustrating the configuration of a signal output circuit according to a fourth embodiment.

As illustrated in FIG. 13, in a fourth embodiment, in a situation where the bridge circuit 62 is included, the resistive element R2 is inserted at the anode side of the diodes D23 and D25, and a resistive element R3 is inserted at the cathode side of the diodes D24 and D26. Therefore, a bridge circuit 64 is formed. The lower end of a resistive element 18 is connected to the anode of the diode D23. The drain of the transistor Q10 is connected to the cathode of the diode D24. The clamping transistor Q21 operates as described with respect to FIG. 11. The description of its operation will be omitted here.

The capacitor C2 is connected between the anode of the diode D25 and the ground, and the capacitor C3 is connected between the cathode of the diode D26 and the ground. The resistive element R2 and the capacitor C2 are included in a CR filter 65, and the resistive element R3 and the capacitor C3 are included in a CR filter 66. The CR filters 65 and 66 are included in the bridge circuit 64. According to the fourth embodiment configured as described above, the same effects as those of the first embodiment can be obtained.

Fifth Embodiment

Figure 14:
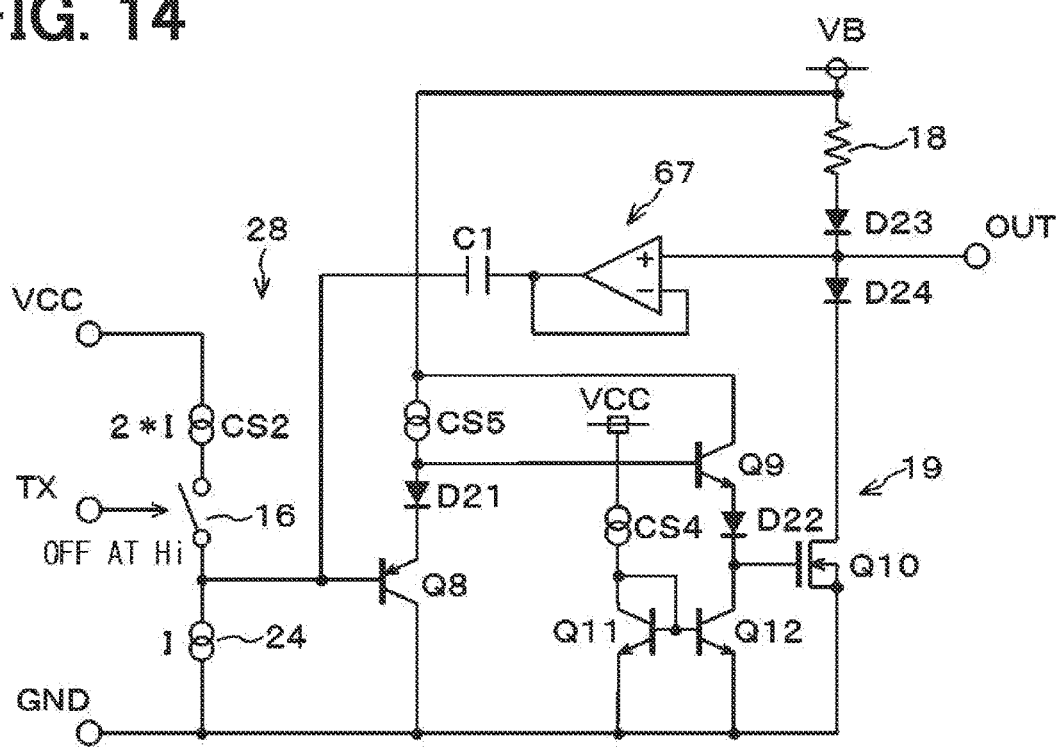
FIG. 14 is a circuit diagram illustrating the configuration of a signal output circuit according to a fifth embodiment.

As illustrated in FIG. 14, in the fifth embodiment, the resistive element R1 is removed, and a voltage follower 67 with the use of an operational amplifier is connected between the output terminal OUT and the capacitor C1. The non-inverting input terminal of the operational amplifier as the input terminal of the voltage follower 67 is connected to the output terminal OUT, and the output terminal of the voltage follower 67 is connected to one end of the capacitor C1.

Due to the frequency response of the operational amplifier, the voltage follower 67 functions as a low-pass filter having a cutoff frequency in an order of MHz. According to the fifth embodiment configured as described above, the same effects as those of the first embodiment can be obtained.

Sixth Embodiment

Figure 15:
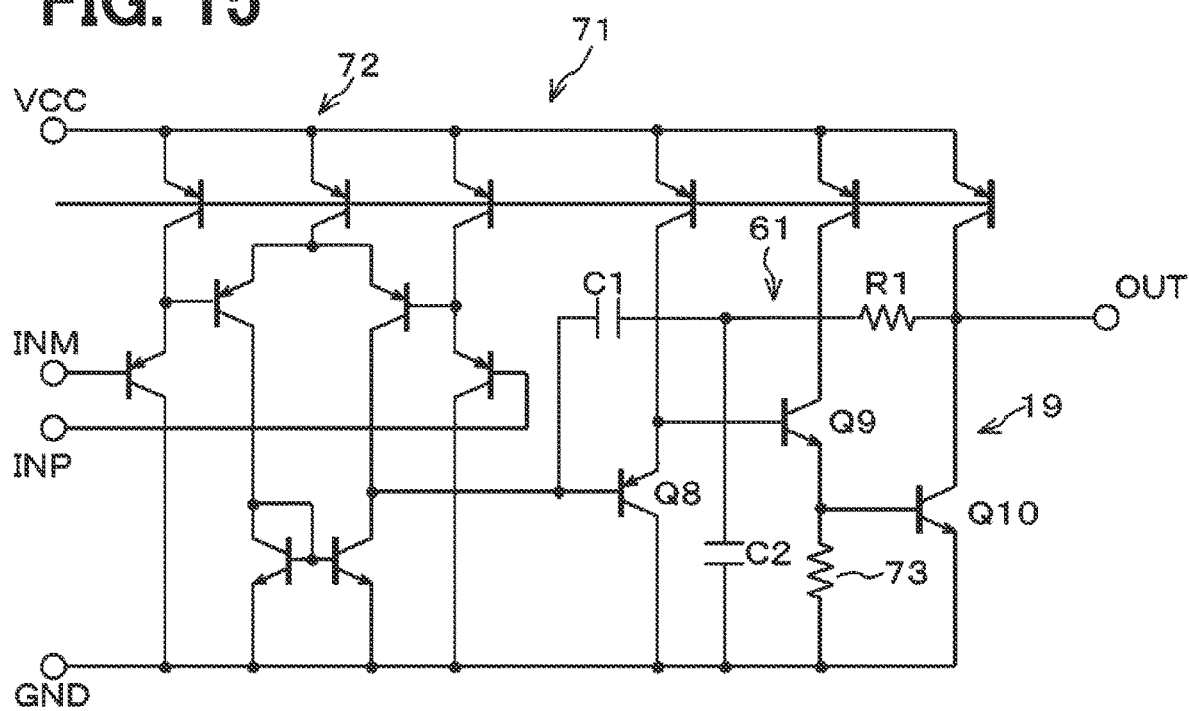
FIG. 15 is a circuit diagram illustrating the configuration of a signal output circuit according to a sixth embodiment.

As illustrated in FIG. 15, the configuration in a sixth embodiment is applied to an internal circuit of the operational amplifier. An operational amplifier 71 corresponding to the signal output circuit includes a differential amplifier 72 as an input unit, a transistor Q8 whose base is connected to one of differential pairs of the differential amplifier 72, and a transistor Q9 whose base is connected to the collector of the transistor Q8. The emitter of the transistor Q9 is connected to the base of the output transistor Q10, and is connected to the ground through a resistive element 73.

The output terminal OUT of the operational amplifier 71 is connected to the base of the transistor Q8 through a series circuit having the resistive element R1 and the feedback capacitor C1. Similar to the first embodiment, the capacitor C2 is connected between the common connection node, which is between the resistive element R1 and the capacitor C1, and the ground. The resistive element R1 and the capacitor C2 are included in the CR filter 61.

According to the sixth embodiment as described above, with regard to the operational amplifier 71 having the feedback capacitor C2, it is possible to reduce the influence of noise entering from the output terminal OUT by adding the capacitor C2 in the CR filter 61.

Seventh Embodiment

Figure 16:
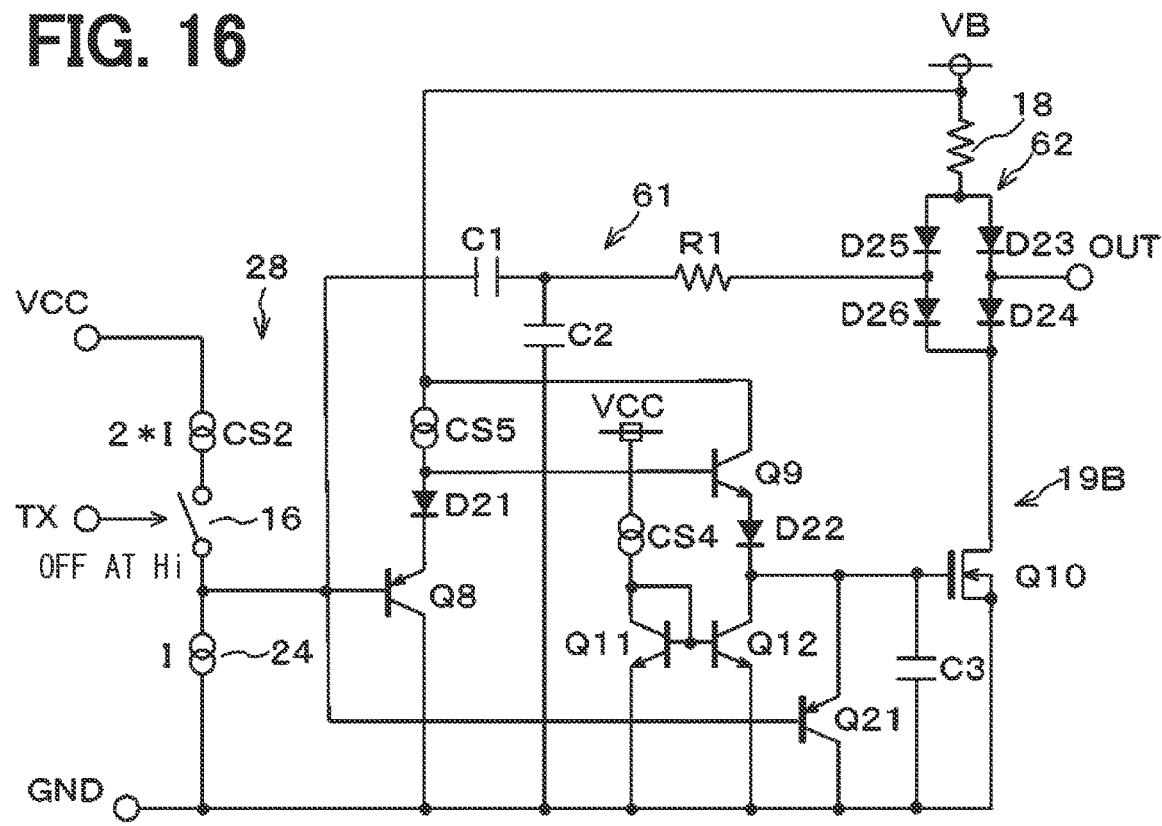
FIG. 16 is a circuit diagram illustrating the configuration of a signal output circuit according to a seventh embodiment.

As illustrated in FIG. 16, in a seventh embodiment, the series circuit having the diodes D22 and D23 is replaced with the bridge circuit 62, and the capacitor C3 is connected with the transistor Q21 in parallel in the configuration of the second embodiment. As a result, an inverting amplifier circuit 19B is formed. With this configuration, it is possible that the transistor Q21 removes noise in a relatively low frequency region, and the capacitor C3 removes noise in a relatively high frequency region.

OTHER EMBODIMENTS

An NPN transistor may be adopted as the output transistor for an open collector configuration. For example, the respective embodiments may be combined with each other if necessary. Although the present disclosure has been made in accordance with the embodiments, it is understood that the present disclosure is not limited to such embodiments and structures. The present disclosure encompasses various modifications and variations within the scope of equivalents. In addition, various combinations and forms, and further, other combinations and forms including only one element, or more or less than these elements are also within the scope and the scope of the present disclosure.

What is claimed is:

1. A signal output circuit comprising:
   an inverting amplifier circuit including an input terminal and an output terminal, the inverting amplifier circuit configured to execute an inverting amplification operation based on an input signal to output a signal to the output terminal at a pull-up state, the inverting amplifier circuit having an output stage being either an open collector or an open drain;
   a feedback capacitor connected between the input terminal and the output terminal of the inverting amplifier circuit;
   a low pass filter circuit having an input and an output, the input being connected to the output terminal of the inverting amplifier, the output being connected to the feedback capacitor;
   an output transistor connected between the output terminal of the inverting amplifier circuit and a ground;
   a charge/discharge circuit connected to the input terminal of the inverting amplifier circuit, the charge/discharge circuit configured to
   charge the feedback capacitor in response to that the input signal is changed to a high level from a low level, and
   discharge the feedback capacitor in response to that the input signal is changed to the low level from the high level; and
   a clamping transistor connected between a conductive control terminal of the output transistor and the ground,
   wherein a conductive control terminal of the clamping transistor is connected to a connection terminal of the feedback capacitor and a connection terminal of the charge/discharge circuit, and
   wherein the clamping transistor conducts in response to that noise is applied to the conductive control terminal of the output transistor, in a situation where the feedback capacitor is discharged.

2. The signal output circuit according to claim 1, further comprising:
   a capacitor connected to the clamping transistor in parallel.

3. The signal output circuit according to claim 1, further comprising:
   a bridge circuit having a first series circuit and a second series circuit connected in parallel, each of the first series circuit and the second series circuit having two diodes connected in a forward direction, the bridge circuit having an anode side located on a downstream side in the forward direction and a cathode side located on an upstream side in the forward direction,
   wherein the anode side of the bridge circuit is connected to a resistive element, which pulls up the output terminal
   wherein the output transistor is connected between the ground and the cathode side of the bridge circuit,
   wherein the first series circuit has a common connection node connected to the output terminal, and the second series circuit has a common connection node connected to the feedback capacitor.

4. The signal output circuit according to claim 3,
   wherein the low pass filter circuit includes a first low pass filter and a second low pass filter,
   wherein the first low pass filter is disposed at the anode side of the bridge circuit facing the resistive element, and the second low pass filter is disposed at the cathode side of the bridge circuit facing the output transistor.

5. The signal output circuit according to claim 1, further comprising:
   a phase compensating resistive element connected to the feedback capacitor in series,
   wherein the low pass filter circuit is connected between the output terminal and the phase compensating resistive element.

6. The signal output circuit according to claim 1,
   wherein the low pass filter circuit is a CR filter.

7. The signal output circuit according to claim 1,
   wherein the low pass filter circuit is a voltage follower including an operational amplifier.

8. The signal output circuit according to claim 3,
   wherein the common connection node in the first series circuit is between the two diodes in the first series circuit, and
   wherein the common connection node in the second series circuit is between the two diodes in the second series circuit.

* * * * *